United States Patent
Sugimoto et al.

(10) Patent No.: US 11,091,850 B2
(45) Date of Patent: Aug. 17, 2021

(54) PRODUCING METHOD OF WIRED CIRCUIT BOARD

(71) Applicant: NITTO DENKO CORPORATION, Osaka (JP)

(72) Inventors: Yuu Sugimoto, Osaka (JP); Hiroyuki Tanabe, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 79 days.

(21) Appl. No.: 15/876,603

(22) Filed: Jan. 22, 2018

(65) Prior Publication Data

US 2018/0209058 A1     Jul. 26, 2018

(30) Foreign Application Priority Data

Jan. 23, 2017  (JP) .............................. JP2017-009187

(51) Int. Cl.
  *C25D 5/02*  (2006.01)
  *H05K 1/05* (2006.01)
  (Continued)

(52) U.S. Cl.
  CPC ................ *C25D 5/02* (2013.01); *C25D 3/48* (2013.01); *C25D 5/022* (2013.01); *C25D 5/10* (2013.01);
  (Continued)

(58) Field of Classification Search
  CPC . C25D 5/02; C25D 5/022; C25D 5/10; C25D 5/36; C25D 5/50; C25D 3/48;
  (Continued)

(56) References Cited

U.S. PATENT DOCUMENTS 2,133,995 A * 10/1938 Lukens ..................... C25D 3/48
 205/170
2,315,568 A *  4/1943 Werniund ................. C25F 1/06
 205/712
(Continued)

FOREIGN PATENT DOCUMENTS

CN  1658739 A  8/2005
CN  101360851 A  2/2009
(Continued)

OTHER PUBLICATIONS

Notification of First Office Action, which was issued by the China National Intellectual Property Administration dated Feb. 1, 2021, in connection with Chinese Patent Application No. 201810060118.1.

*Primary Examiner* — Louis J Rufo
(74) *Attorney, Agent, or Firm* — Edwards Neils LLC; Jean C. Edwards, Esq.

(57) ABSTRACT

A method for producing a wired circuit board including a stainless steel supporting layer having a stainless steel terminal includes a first step of preparing the stainless steel supporting layer having a passive film formed on the surface thereof and a second step of forming a first gold plating layer on the surface of the stainless steel terminal. In the second step, the stainless steel supporting layer is immersed in a first gold plating solution containing a weak acid and a gold compound without containing a strong acid, and electricity is supplied to the stainless steel supporting layer so that the passive film is removed and the first gold plating layer is formed on the surface of the stainless steel terminal.

4 Claims, 9 Drawing Sheets

(51) Int. Cl.
    *C25D 7/00*     (2006.01)
    *C25D 3/48*     (2006.01)
    *C25D 5/50*     (2006.01)
    *H05K 3/24*     (2006.01)
    *C25D 5/10*     (2006.01)
    *C25D 5/36*     (2006.01)
    *H05K 3/18*     (2006.01)
    *H05K 3/46*     (2006.01)
    *G11B 5/48*     (2006.01)
    *H05K 1/03*     (2006.01)
    *H05K 1/11*     (2006.01)
    *H05K 1/02*     (2006.01)

(52) U.S. Cl.
    CPC ............... *C25D 5/36* (2013.01); *C25D 5/50* (2013.01); *C25D 7/00* (2013.01); *H05K 1/05* (2013.01); *H05K 3/188* (2013.01); *H05K 3/241* (2013.01); *H05K 3/243* (2013.01); *H05K 3/4644* (2013.01); *G11B 5/4833* (2013.01); *H05K 1/0281* (2013.01); *H05K 1/0393* (2013.01); *H05K 1/053* (2013.01); *H05K 1/056* (2013.01); *H05K 1/11* (2013.01); *H05K 2203/1105* (2013.01); *H05K 2203/1476* (2013.01)

(58) Field of Classification Search
    CPC . C25D 7/00; H05K 1/05; H05K 1/053; H05K 1/056; H05K 2203/1476
    See application file for complete search history.

(56) References Cited

U.S. PATENT DOCUMENTS

| | | | | |
|---|---|---|---|---|
| 2,905,601 A * | 9/1959 | Duva | | C25D 3/48 205/247 |
| 3,104,212 A * | 9/1963 | Duva | | C25D 3/48 205/268 |
| 3,373,094 A * | 3/1968 | Foulke | | C25D 3/48 205/247 |
| 3,598,706 A * | 8/1971 | Freedman et al. | | C25D 3/48 205/268 |
| 5,575,900 A * | 11/1996 | Antelman | | C25D 3/48 205/267 |
| 6,312,580 B1 * | 11/2001 | Antelman | | C25D 3/48 205/117 |
| 2005/0186332 A1 | 8/2005 | Funada et al. | | |
| 2013/0071688 A1 | 3/2013 | Bessho | | |
| 2013/0330654 A1 * | 12/2013 | Balogh | | H01M 8/0206 429/513 |
| 2014/0017512 A1 | 1/2014 | Iimori et al. | | |
| 2014/0023876 A1 * | 1/2014 | Nagata | | C25D 5/10 428/596 |
| 2014/0311776 A1 * | 10/2014 | Takakura | | H05K 3/44 174/255 |
| 2015/0156892 A1 | 6/2015 | Tanabe et al. | | |
| 2016/0208401 A1 * | 7/2016 | Swanson | | C25D 7/00 |
| 2017/0069918 A1 | 3/2017 | Okuno et al. | | |

FOREIGN PATENT DOCUMENTS

| | | |
|---|---|---|
| CN | 102906311 A | 1/2013 |
| CN | 103069629 A | 4/2013 |
| CN | 103540979 A | 1/2014 |
| CN | 103665010 A | 3/2014 |
| CN | 104109896 A | 10/2014 |
| CN | 104703400 A | 6/2015 |
| CN | 106103808 A | 11/2016 |
| JP | 2014-034702 A | 2/2014 |
| WO | 2007/058604 A1 | 5/2007 |

\* cited by examiner

PRODUCING METHOD OF WIRED CIRCUIT BOARD

CROSS-REFERENCE TO RELATED APPLICATION

The present application claims priority from Japanese Patent Application No. 2017-009187 filed on Jan. 23, 2017, the contents of which are hereby incorporated by reference into this application.

BACKGROUND OF THE INVENTION

Field of the Invention

The present invention relates to a method for producing a wired circuit board.

Description of Related Art

A method in which a terminal for electrical connection is formed on a stainless steel board, and a gold plating layer is formed on the terminal by gold plating has been known.

For example, a forming method of a gold plating pattern on the stainless steel board has been proposed in which a desired site of the stainless steel board is immersed in a hydrochloric acid-based plating solution, and a first gold plating layer is formed on the immersed site (ref: for example, Japanese Unexamined Patent Publication No. 2014-34702).

In the method of Patent Document 1, adhesive properties of the stainless steel board with the first gold plating layer are improved.

In the method of Patent Document 1, a conductive layer is separately provided on the stainless steel board, and a conductive terminal is provided on the conductive layer.

SUMMARY OF THE INVENTION

A passive film is provided on the surface of the stainless steel board, so that in view of improvement of the adhesive properties described above, the removal of the passive film is required.

In the method described in Japanese Unexamined Patent Publication No. 2014-34702, the above-described passive film is removed by immersing the stainless steel board in the hydrochloric acid-based plating solution, and the gold plating layer is formed on the terminal of the stainless steel board.

It has been considered that by using hydrochloric acid-based plating bath, the gold plating layer is formed on the conductive terminal, and forming of the gold plating layer on the terminal of the stainless steel board and forming of the gold plating layer on the conductive terminal are performed by using the same plating bath. However, in such a consideration, there is a disadvantage that the conductive terminal is corroded by the hydrochloric acid-based plating solution.

Meanwhile, when plating bath that is different from the hydrochloric acid-based plating bath used in forming the gold plating layer on the terminal of the stainless steel board is prepared, and the gold plating layer is formed on the conductive terminal by using the plating bath, there is a disadvantage that the number of equipment increases and the production step becomes complicated.

An object of the present invention is to provide a method for producing a wired circuit board capable of easily forming the first gold plating layer on the stainless steel terminal with easy equipment.

The present invention [1] includes a method for producing a wired circuit board including a stainless steel supporting layer having a stainless steel terminal including a first step of preparing the stainless steel supporting layer having a passive film formed on the surface thereof and a second step of forming a first gold plating layer on the surface of the stainless steel terminal, wherein in the second step, the stainless steel supporting layer is immersed in a first gold plating solution containing a weak acid and a gold compound without containing a strong acid, and electricity is supplied to the stainless steel supporting layer so that the passive film is removed and the first gold plating layer is formed on the surface of the stainless steel terminal.

According to the producing method, in the second step, the stainless steel supporting layer is immersed in the first gold plating solution containing the weak acid and the gold compound without containing the strong acid, so that in the second step, when the electricity is supplied to the stainless steel supporting layer, the passive film is surely removed and the first gold plating layer can be formed on the surface of the stainless steel terminal.

The first gold plating solution does not contain the strong acid, so that when the first gold plating solution is used, the gold plating layer can be formed on the conductive terminal, while corrosion of the conductive terminal is suppressed. Thus, the first gold plating layer can be easily formed on the stainless steel terminal with easy equipment.

The present invention [2] includes the method for producing a wired circuit board described in [1] further including: after the second step, a third step of forming a second gold plating layer on the surface of the first gold plating layer, wherein in the third step, the stainless steel supporting layer is immersed in a second gold plating solution containing a gold compound without containing an acid, and electricity is supplied to the stainless steel supporting layer so that the second gold plating layer is formed on the surface of the first gold plating layer; and the content ratio of the gold compound in the second gold plating solution is higher than that of the gold compound in the first gold plating solution.

According to the producing method, the content ratio of the gold compound in the second gold plating solution in the third step is higher than that of the gold compound in the first gold plating solution in the second step, so that the thick second plating layer can be efficiently formed for a short period of time.

The present invention [3] includes the method for producing a wired circuit board described in [1] or [2], wherein the wired circuit board further includes a conductive layer supported by the stainless steel supporting layer and having a conductive terminal, further including: a fourth step of forming a third gold plating layer on the surface of the conductive terminal; wherein in the fourth step, the conductive layer is immersed in a third gold plating solution containing a weak acid and a gold compound without containing a strong acid, and electricity is supplied to the conductive layer so that the third gold plating layer is formed on the surface of the conductive terminal; and the ratio of the current density in the second step to the current density in the fourth step is 2 or more.

In the producing method, the ratio of the current density in the second step to the current density in the fourth step is 2 or more. That is, the current density in the second step can be set higher than that in the fourth step, so that in the second step, the passive film can be further more surely removed. As a result, the wired circuit board including the first gold plating layer having adhesive properties with respect to the stainless steel terminal can be produced.

The present invention [4] includes the method for producing a wired circuit board described in any one of [1] to [3], wherein the wired circuit board further includes a conductive layer supported by the stainless steel supporting layer and having a conductive terminal, further including: after the second step, a fourth step of forming a third gold plating layer on the surface of the conductive terminal; wherein in the fourth step, the conductive layer is immersed in a third gold plating solution containing a weak acid and a gold compound without containing a strong acid, and electricity is supplied to the conductive layer so that the third gold plating layer is formed on the surface of the conductive terminal; and the second step and the fourth step are performed in the same plating bath.

According to the producing method, the second step and the fourth step are performed in the same plating bath, so that a producing device and a producing step can be simplified.

The present invention [5] includes the method for producing a wired circuit board described in any one of [1] to [4] further including: after the second step, a heating step of heating the first gold plating layer.

According to the producing method, in the heating step, the first gold plating layer is heated, so that the wired circuit board including the first gold plating layer having adhesive properties with respect to the stainless steel terminal can be produced.

The present invention [6] includes the method for producing a wired circuit board described in [2] further including: after the third step, a heating step of heating the first gold plating layer and the second gold plating layer.

According to the producing method, in the heating step, the first gold plating layer and the second gold plating layer are heated, so that the wired circuit board including the first gold plating layer and the second gold plating layer that have adhesive properties with respect to the stainless steel terminal can be produced.

According to the present invention, the wired circuit board including the first gold plating layer having excellent adhesive properties with respect to the stainless steel terminal can be produced.

BRIEF DESCRIPTION OF THE DRAWINGS

FIG. 1A illustrating a first step of preparing a suspension board with circuit,

FIG. 1B illustrating a second step of forming a first gold plating layer, and

FIG. 1C illustrating a third step of forming a second gold plating layer.

FIG. 2D illustrating a fourth step of preparing a third gold plating layer,

FIG. 2E illustrating a fifth step of forming a fourth gold plating layer, and

FIG. 2F illustrating a sixth step of removing a second plating resist.

FIG. 8A illustrating a second step of forming a first gold plating layer and

FIG. 8B illustrating a third step of forming a second gold plating layer.

FIG. 9A illustrating a fourth step of preparing a third gold plating layer and

FIG. 9B illustrating a fifth step of forming a fourth gold plating layer.

DETAILED DESCRIPTION OF THE INVENTION

One Embodiment

Figure 2D:
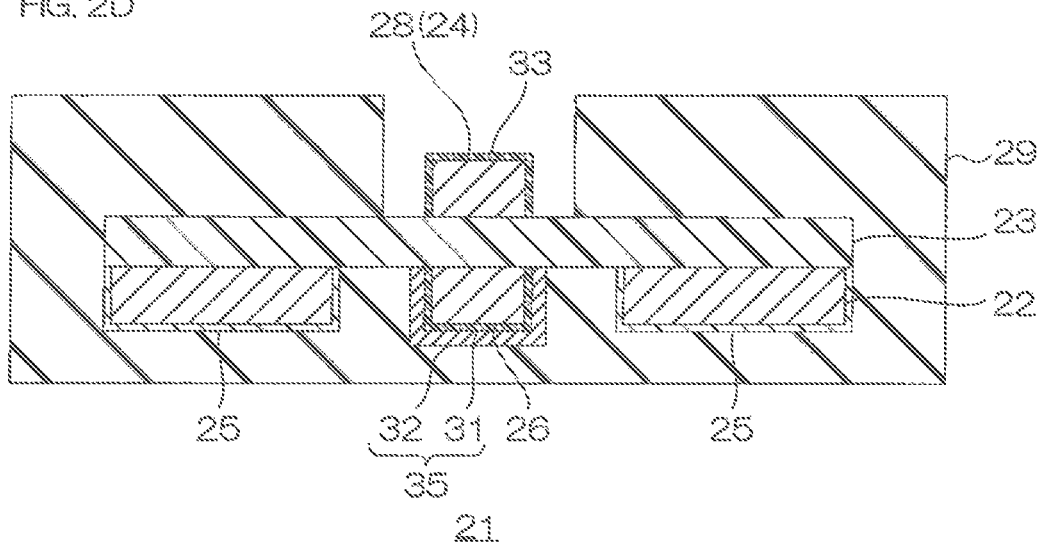
FIGS. 2D to 2F, subsequent to FIG. 1C, show partial process drawings for illustrating the method for producing a suspension board with circuit that is one embodiment of the method for producing a wired circuit board of the present invention.
Figure 2E:
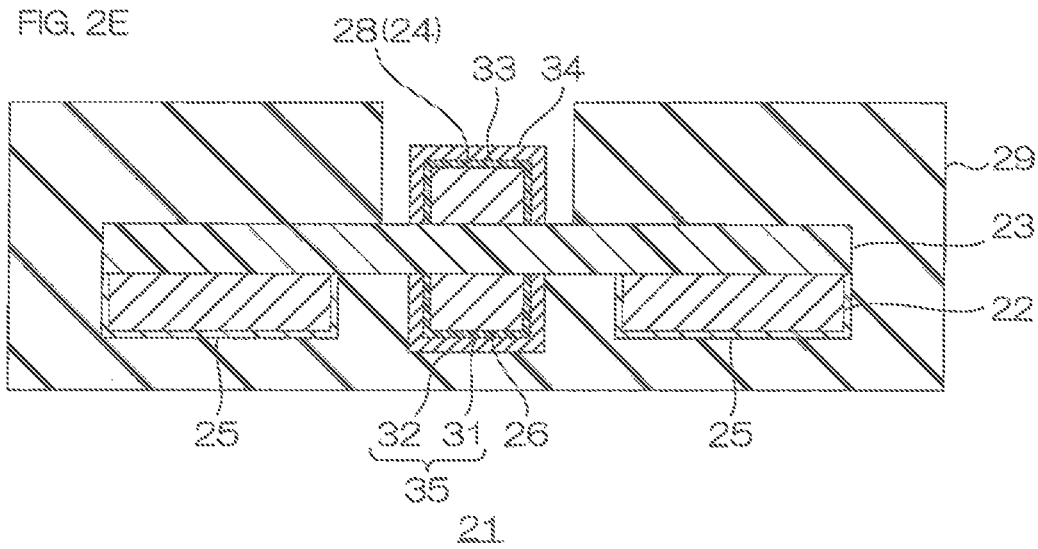
Figure 2F:
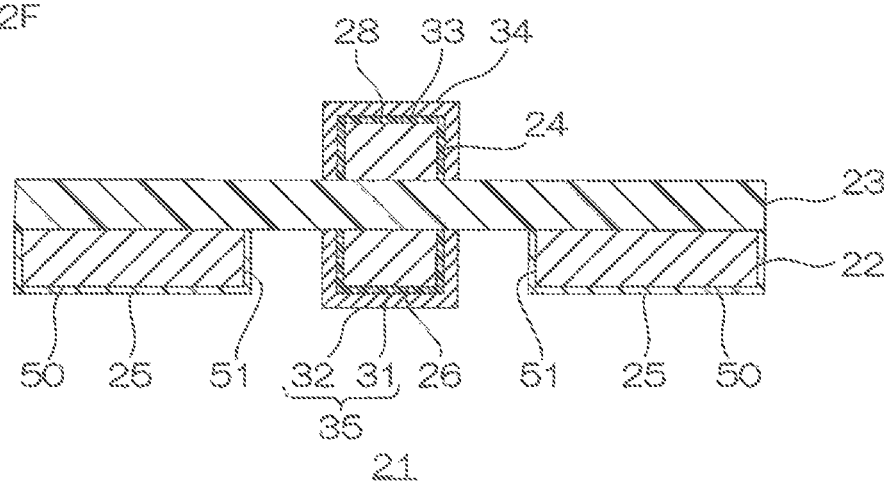

As shown in FIG. 2F, a method for producing a suspension board with circuit that is one embodiment of a method for producing a wired circuit board of the present invention is a method for producing a suspension board with circuit 21 including a stainless steel supporting layer 22 and a conductive layer 24.

To be specific, the suspension board with circuit 21 sequentially includes the stainless steel supporting layer 22, a base insulating layer 23, the conductive layer 24, and a cover insulating layer (not shown) in a thickness direction (up-down direction).

The stainless steel supporting layer 22 is the lower-most layer of the suspension board with circuit 21. The stainless steel supporting layer 22 has a generally flat plate (sheet) shape extending in a plane direction perpendicular to the thickness direction. The stainless steel supporting layer 22 is a supporting member that supports the suspension board with circuit 21. The stainless steel supporting layer 22 has a supporting main body portion 50, an opening portion 51, and a stainless steel terminal 26.

The outer shape of the supporting main body portion 50 is the same as that of the suspension board with circuit 21.

The opening portion 51 is formed at the inside of the supporting main body portion 50, and passes through the stainless steel supporting layer 22 in the thickness direction. The supporting main body portion 50 around the opening portion 51 has a generally frame shape when viewed from the bottom.

The stainless steel terminal 26 is disposed at the inside of the opening portion 51. The outer end edge (circumferential end edge) of the stainless steel terminal 26 is disposed at spaced intervals to the inner end edge of the supporting main body portion 50 at the inside thereof in the plane direction (direction perpendicular to the thickness direction). In this manner, the stainless steel terminal 26 is insulated from the supporting main body portion 50.

A stainless steel material for forming the stainless steel supporting layer 22 is not particularly limited, and an example thereof includes SUS 304.

The stainless steel supporting layer 22 has a thickness of, for example, 15 μm or more, preferably 20 μm or more, and for example, 50 μm or less, preferably 30 μm or less.

A passive film 25 is formed on the surface of the supporting main body portion 50.

Meanwhile, the above-described passive film 25 is not formed on the surface of the stainless steel terminal 26, and a first gold plating layer 31 and a second gold plating layer 32 (gold plating layer 35) to be described later are formed thereon.

The base insulating layer 23 is disposed on the upper surface of the stainless steel supporting layer 22. The base insulating layer 23 has a generally flat plate (sheet) shape extending in the plane direction. The base insulating layer 23 has a pattern corresponding to the conductive layer 24 to be described next. A part of the lower surface of the base insulating layer 23 is exposed from the above-described opening portion 51 downwardly. The base insulating layer 23 is, for example, made of an insulating material such as polyimide. The thickness of the base insulating layer 23 is appropriately set in accordance with its usages and purpose.

The conductive layer 24 is disposed on the upper surface of the base insulating layer 23. The conductive layer 24 continuously has a conductive wire and a conductive terminal 28 that is continuous thereto. A third gold plating layer 33 and a fourth gold plating layer 34 to be described later are formed on the surface of the conductive terminal 28.

The conductive layer 24 is, for example, made of a conductive material such as copper, nickel, and an alloy thereof. The conductive layer 24 has a thickness of, for example, 3 μm or more, preferably 5 μm or more, and for example, 50 μm or less, preferably 20 μm or less.

The cover insulating layer (not shown) is the upper-most layer of the suspension board with circuit 21. The cover insulating layer (not shown) has a pattern of exposing the conductive terminal 28 and covering a conductive wire (not shown).

Figure 3:
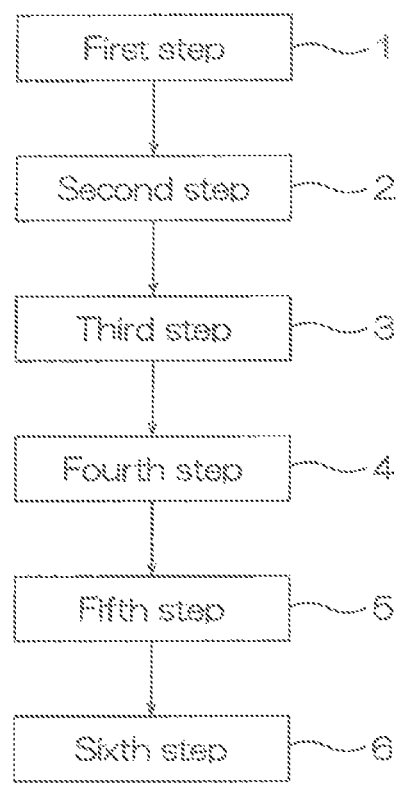
FIG. 3 shows a flow chart of the method for producing a suspension board with circuit shown in FIGS. 1A to 2F.

As shown in FIG. 3, the method for producing the suspension board with circuit 21 includes a first step 1, a second step 2, a third step 3, a fourth step 4, a fifth step 5, and a sixth step 6 as one example of a heating step. The first step 1, the second step 2, the third step 3, the fourth step 4, the fifth step 5, and the sixth step 6 are sequentially performed.

[First Step]

Figure 1A:
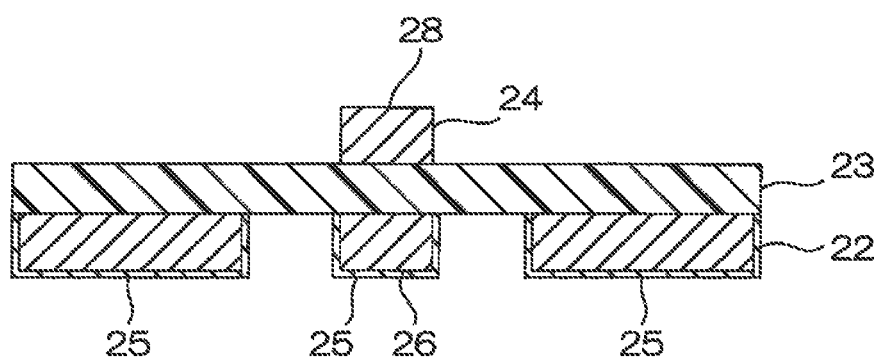
FIGS. 1A to 1C show partial process drawings for illustrating a method for producing a suspension board with circuit that is one embodiment of a method for producing a wired circuit board of the present invention.

As shown in FIG. 1A, in the first step 1, the suspension board with circuit 21 including the stainless steel supporting layer 22, the base insulating layer 23, the conductive layer 24, and the cover insulating layer (not shown) is prepared. The stainless steel supporting layer 22 has the supporting main body portion 50, the opening portion 51, and the stainless steel terminal 26. Also, the passive film 25 is formed on both surfaces of the supporting main body portion 50 and the stainless steel terminal 26.

The passive film 25 covers the lower surface and the side surfaces (including the outer side surfaces and the inner side surfaces) of the stainless steel supporting layer 22. The passive film 25 is a thin film which is obtained by passivating stainless steel that forms the stainless steel supporting layer 22. The passive film 25 can also include, for example, a metal oxide such as chromium oxide, nickel oxide, and a complex oxide thereof.

The passive film 25 has a thickness of, for example, 1 μm or more, preferably 2 μm or more, and for example, 20 μm or less, preferably 10 m or less.

The passive film 25 is a film that reduces the adhesive force of the first gold plating layer 31 to be described later with respect to the stainless steel supporting layer 22 on the surface of the stainless steel supporting layer 22, and is originally an unnecessary film. However, the passive film 25 is inevitably formed on the surface of the stainless steel supporting layer 22.

The suspension board with circuit 21 is prepared as assembly sheets 30 in which a plurality thereof are disposed at spaced intervals to each other.

[Second Step to Fifth Step]

Figure 4:
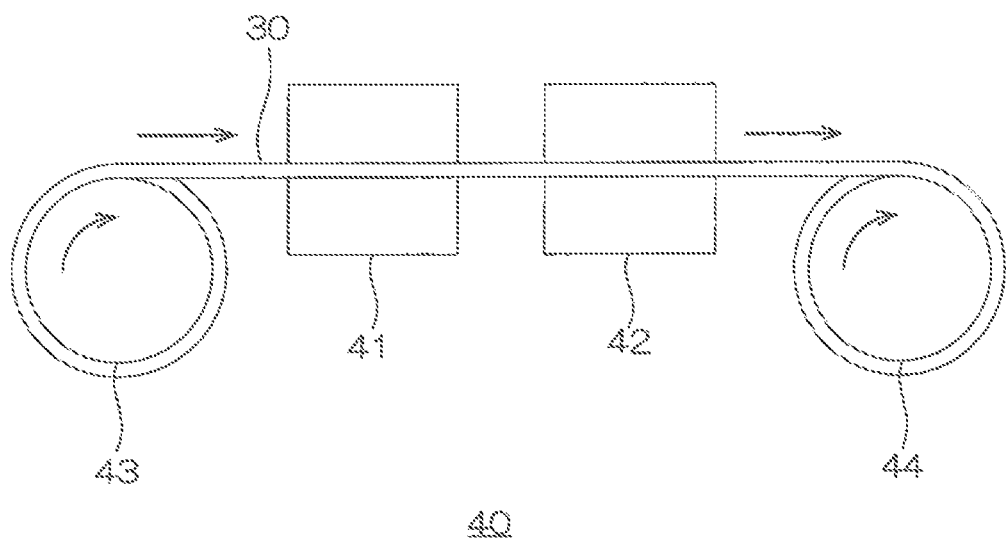
FIG. 4 shows a schematic drawing of a plating device used in the method for producing a suspension board with circuit.

The second step 2 to the fifth step 5 are performed by using a plating device 40 shown in FIG. 4.

[Plating Device]

As shown in FIG. 4, the plating device 40 sequentially includes a first roll 43, a first plating tank 41, a second plating tank 42, and a second roll 44 toward the downstream side in a conveyance direction of the assembly sheet 30.

The assembly sheet 30 is wound around the first roll 43 to be capable of being delivered.

The first plating tank 41 is disposed at the downstream side in the conveyance direction of the first roll 43. A first gold plating solution is housed in the first plating tank 41. The first plating tank 41 is made so as to be capable of heating the first gold plating solution.

The first gold plating solution contains a weak acid and a gold compound without containing a strong acid.

Examples of the strong acid include inorganic acids such as nitric acid, hydrochloric acid, and sulfuric acid.

The weak acid has a function of adjusting pH of the first gold plating solution. The weak acid is not particularly limited, and examples thereof include organic acids. The content ratio of the weak acid in the first gold plating solution is, for example, 1 mass % or more, preferably 5 mass % or more, and for example, 40 mass % or less, preferably 20 mass % or less.

The gold compound is a gold precursor used for forming the first gold plating layer 31, and is dissolved in the first gold plating solution. Examples of the gold compound include tetrachloroauric acid, metal salt tetrachloride, gold trichloride, gold cyanide, gold potassium cyanide (KAu(CN)$_2$), trichloride diethylamine auric acid, and ethylenediamine gold complex. These gold compounds can be used alone or in combination of two or more. Preferably, gold potassium cyanide is used. The content ratio of the gold compound in the first gold plating solution is, for example, 0.01 mass % or more, preferably 0.1 mass % or more, and for example, 1.0 mass % or less, preferably 0.5 mass % or less. The content ratio of the gold in the first gold plating solution is, for example, 0.1 g/L or more, preferably 0.5 g/L or more, and for example, 5 g/L or less, preferably 1.5 g/L or less.

The first gold plating solution can also further contain an organic acid salt. The organic acid salt has a function of adjusting the electric conductivity of the first gold plating solution. The organic acid salt is not particularly limited. The content ratio of the organic acid salt in the first gold plating solution is, for example, 0.5 mass % or more, preferably 3 mass % or more, and for example, 30 mass % or less, preferably 15 mass % or less.

The ratio of water is the remaining portion of the content ratio of the above-described component.

The first gold plating solution has a pH of, for example, 3.0 or more, preferably 3.5 or more, and for example, 5.0 or less, preferably 4.0 or less.

The temperature of the first gold plating solution is not particularly limited, and is, for example, higher than the normal temperature. To be specific, the temperature thereof is, for example, 30° C. or more, preferably 40° C. or more, more preferably 45° C. or more, and for example, 70° C. or less, preferably 60° C. or less, more preferably 55° C. or less.

A first electrode (not shown) is disposed in the first plating tank 41 so as to be immersed in the first gold plating solution. The first electrode is connected to a first rectifier (not shown).

The second plating tank 42 is disposed at the downstream side in the conveyance direction of the first plating tank 41. A second gold plating solution is housed in the second plating tank 42. The second plating tank 42 is made so as to be capable of heating the second gold plating solution.

The second gold plating solution contains a gold compound without containing an acid.

Examples of the acid include the strong acid and the weak acid illustrated in the first gold plating solution.

As the gold compound, the same gold compound as that contained in the first gold plating solution is used. Preferably, gold potassium cyanide is used.

The content ratio of the gold compound in the second gold plating solution is, for example, 0.5 mass % or more, preferably 1.0 mass % or more, and for example, 5.0 mass % or less, preferably 1.5 mass % or less. The content ratio of the gold compound in the second gold plating solution is higher than that of the gold compound in the first gold plating solution, and to be specific, the ratio of the content ratio of the gold compound in the second gold plating solution to that of the gold compound in the first gold plating solution is, for example, above 1, preferably 3 or more, more preferably 5 or more, further more preferably 7.0 or more, and for example, 50 or less.

When the content ratio of the gold compound in the second gold plating solution is higher than that of the gold compound in the first gold plating solution, the second gold plating layer 32 can be efficiently formed.

The content ratio of the gold in the second gold plating solution is, for example, 0.5 g/L or more, preferably 5 g/L or more, and for example, 50 g/L or less, preferably 10 g/L or less. The content ratio of the gold in the second gold plating solution is higher than that of the gold in the first gold plating solution, and to be specific, the ratio of the content ratio of the gold in the second gold plating solution to that of the gold in the first gold plating solution is, for example, above 1, preferably 3 or more, more preferably 5 or more, further more preferably 7.0 or more, and for example, 50 or less.

When the content ratio of the gold in the second gold plating solution is higher than that of the gold in the first gold plating solution, the second gold plating layer 32 can be efficiently formed.

The second gold plating solution can also further contain additives such as organic acid salts, inorganic acid salts, and crystal regulators.

The organic acid salt has a function of adjusting the electric conductivity of the second gold plating solution. The organic acid salt is not particularly limited. The content ratio of the organic acid salt in the second gold plating solution is, for example, 1 mass % or more, and for example, 40 mass % or less.

The inorganic acid salt has a function of adjusting the electric conductivity of the second gold plating solution. The inorganic acid salt is not particularly limited, and as an aqueous solution thereof, one that shows neutrality (pH 6 to 8) is used. The content ratio of the inorganic acid salt in the second gold plating solution is, for example, 0.1 mass % or more, and for example, 10 mass % or less.

The crystal regulator is an auxiliary that promotes smooth deposition of the second gold plating layer 32 in the third step 3. Examples of the crystal regulator include salts of metal such as thallium, lead, and bismuth (for example, sulfate, nitrate, organic acid salt, or the like).

These additives can be appropriately used alone or in combination. The content ratio of the crystal regulator in the second gold plating solution is, as the content ratio of the metal, for example, 0.0001 mass % or more, and for example, 0.02 mass % or less, preferably 0.005 mass % or less.

The ratio of the water is the remaining portion of the content ratio of the above-described component.

The second gold plating solution has a pH of, for example, 5.0 or more, preferably 6.0 or more, and for example, 9.0 or less, preferably 7.5 or less.

The temperature of the second gold plating solution is not particularly limited, and for example, higher than the normal temperature. To be specific, the temperature thereof is, for example, 30° C. or more, preferably 50° C. or more, and for example, 80° C. or less, preferably 70° C. or less. The temperature thereof can be also set higher than that of the first gold plating solution, and to be specific, for example, set higher for 5° C. or more, preferably 10° C. or more.

A second electrode (not shown) is disposed in the second plating tank 42 so as to be immersed in the second gold plating solution. The second electrode is connected to a second rectifier (not shown).

The second roll 44 is disposed at the downstream side in the conveyance direction of the second plating tank 42. The assembly sheet 30 is wound around the second roll 44 to be capable of winding up the assembly sheet 30.

[Second Step]

Before the second step 2, first, the assembly sheet 30 is wound around the first roll 43 in the plating device 40.

Figure 1B:
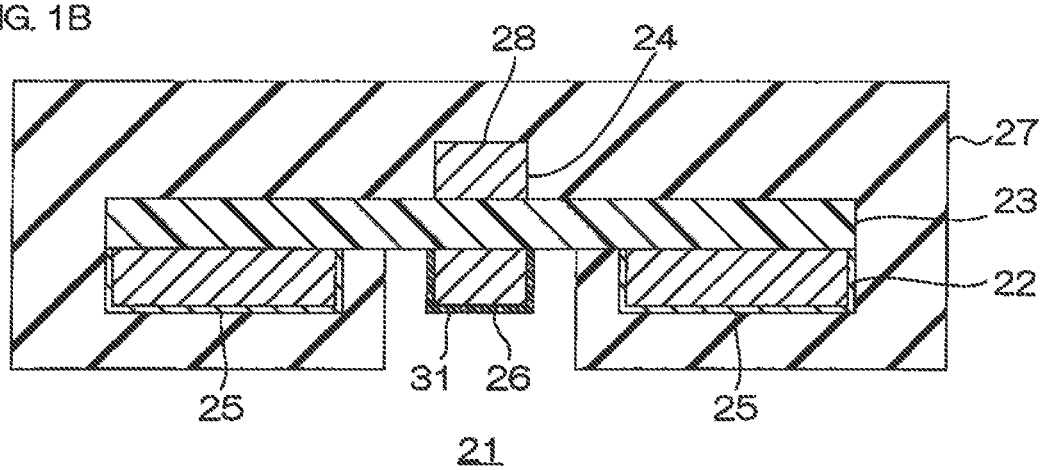

Subsequently, as shown in FIG. 1B, the second step 2 is performed.

The second step 2 is gold strike plating. As shown in FIGS. 1A and 1B, in the second step 2, the first gold plating layer 31 is formed on the surface of the stainless steel terminal 26, while the passive film 25 that is formed on the surface of the stainless steel terminal 26 is removed.

To be specific, in performing the second step 2, first, a first plating resist 27 is disposed in the suspension board with circuit 21. The first plating resist 27 is disposed in the suspension board with circuit 21 in a pattern of exposing the stainless steel terminal 26 and the neighborhood thereof and covering the conductive layer 24.

As shown in FIG. 4, in the second step 2, the assembly sheet 30 is continuously sent out (conveyed) from the first roll 43 toward the first plating tank 41. In this manner, the stainless steel terminal 26 (the stainless steel supporting layer 22) is immersed in the first gold plating solution. In the second step 2, the stainless steel supporting layer 22 is in contact with a power feeding member (not shown) such as a power feeding roll that is electrically connected to the first rectifier in the first plating tank 41.

In the second step 2, the assembly sheet 30 is disposed facing the first electrode in the first gold plating solution.

A voltage is applied between the stainless steel terminal 26 and the first electrode (not shown) by the first rectifier (not shown). Then, the stainless steel terminal 26 becomes a cathode, and the first electrode becomes an anode. The above-described application of the voltage is performed by supplying electricity to the stainless steel supporting layer 22 and the first electrode (not shown).

The current density of the stainless steel terminal 26 in the second step 2 is, in view of surely removing the passive film 25, relatively high, and for example, higher than that of the stainless steel terminal 26 in the regular gold strike plating. To be specific, the current density of the stainless steel terminal 26 is, for example, 1 A/dm$^2$ or more, preferably 2 A/dm$^2$ or more, more preferably 3 A/dm$^2$ or more, and for example, 1000 A/dm$^2$ or less.

The current density of the stainless steel terminal 26 is an amount of current of the stainless steel terminal 26 per unit area, and is a value (application current [A]/surface area [dm$^2$] of the stainless steel terminal 26) obtained by dividing the application current by the surface area (exposed area) of the stainless steel terminal 26.

The application time of the second step 2 is, for example, 10 seconds or more, and for example, 100 seconds or less. The application time is set in accordance with the size (length in the conveyance direction) of the first plating tank 41 and the conveyance rate.

Then, as shown in FIG. 1B, the first gold plating layer 31 is formed on the surface of the stainless steel terminal 26, while the passive film 25 is removed.

The thickness of the first gold plating layer 31 is smaller than that of the gold plating layer that is usually provided on the stainless steel terminal 26. To be specific, the first gold plating layer 31 has a thickness of, for example, 20 nm or more, preferably 100 nm or more, and for example, 1000 nm or less, preferably 500 nm or less.

[Third Step]

Figure 1C:
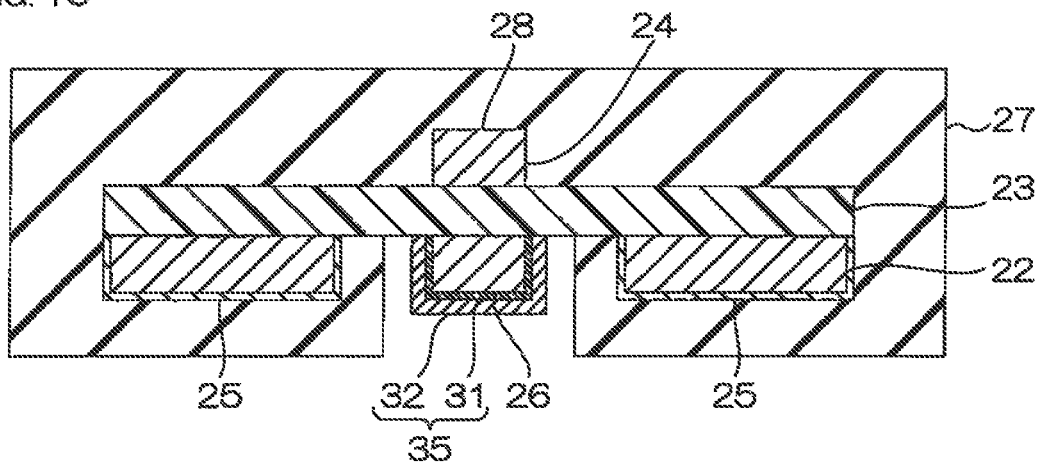

As shown in FIG. 1C, in the third step 3, the second gold plating layer 32 is formed on the surface of the first gold plating layer 31.

The third step 3 is gold soft plating. In the third step 3, the second gold plating layer 32 having a larger thickness than that of the first gold plating layer 31 is formed on the surface of the first gold plating layer 31.

As shown in FIG. 4, in the third step 3, the assembly sheet 30 in which the first plating resist 27 is disposed and the first gold plating layer 31 (ref: FIG. 1B) is formed is conveyed from the first plating tank 41 to the second plating tank 42. In this manner, the first gold plating layer 31 (the stainless steel terminal 26 in which the first gold plating layer 31 is formed) is immersed in the second gold plating solution. In the third step 3, the conductive layer 24 is in contact with a power feeding member (not shown) such as a power feeding roll that is electrically connected to the second rectifier in the second plating tank 42.

In the third step 3, the assembly sheet 30 is disposed facing the second electrode in the second gold plating solution.

A voltage is applied between the first gold plating layer 31 and the second electrode by the second rectifier (not shown). Then, the first gold plating layer 31 becomes a cathode, and the second electrode becomes an anode. The above-described application of the voltage is performed by supplying electricity to the stainless steel supporting layer 22 and the second electrode (not shown).

The current density of the first gold plating layer 31 in the third step 3 is low with respect to that of the stainless steel terminal 26 in the second step 2, and to be specific, for example, 200 A/dm$^2$ or less, preferably 10 A/dm$^2$ or less, more preferably 1.0 A/dm$^2$ or less, and for example, 0.1 A/dm$^2$ or more. The ratio of the current density of the stainless steel terminal 26 in the second step 2 to that of the first gold plating layer 31 in the third step 3 (the current density of the stainless steel terminal 26 in the second step 2/the current density of the first gold plating layer 31 in the third step 3) is, for example, above 1, preferably 5 or more, more preferably 10 or more, and for example, 100 or less.

The current density of the first gold plating layer 31 is an amount of current of the first gold plating layer 31 per unit area, and is a value (application current [A]/surface area [dm$^2$] of the first gold plating layer 31) obtained by dividing the application current by the surface area (exposed area) of the first gold plating layer 31.

The application time of the third step 3 is, for example, 30 seconds or more, and for example, 600 seconds or less. The application time is set in accordance with the size (length in the conveyance direction) of the first plating tank 41 and the conveyance rate.

In this manner, the second gold plating layer 32 is formed on the surface of the first gold plating layer 31. The second gold plating layer 32 has a thickness of, for example, 10 nm or more, preferably 50 nm or more, and for example, 5000 nm or less, preferably 3000 nm or less. The ratio of the thickness of the second gold plating layer 32 to that of the first gold plating layer 31 is, for example, 0.1 or more, preferably 0.4 or more, and for example, 50 or less, preferably 10 or less.

The first gold plating layer 31 and the second gold plating layer 32 form the gold plating layer 35. The gold plating layer 35 consists of only the first gold plating layer 31 and the second gold plating layer 32. In FIGS. 1C to 2F, although a border line is depicted between the first gold plating layer 31 and the second gold plating layer 32, the gold plating layer 35 practically consists of a single layer. The thickness of the gold plating layer 35 is the total amount of the thickness of the first gold plating layer 31 and the thickness of the second gold plating layer 32, and is, for example, 10 nm or more, preferably 50 nm or more, and for example, 1000 nm or less, preferably 500 nm or less.

Thereafter, though not shown, the first plating resist 27 is removed.

Thereafter, the suspension board with circuit 21 is wound up by the second roll 44.

[Fourth Step and Fifth Step]

As shown in FIG. 2D, in the fourth step 4, the third gold plating layer 33 is formed on the surface of the conductive terminal 28, and thereafter, as shown in FIG. 2E, in the fifth step 5, the fourth gold plating layer 34 is formed on the surface of the third gold plating layer 33.

As shown in FIG. 4, in the fourth step 4 and the fifth step 5, the plating device 40 that is used in the second step 2 and the third step 3 is used again. That is, the plating device 40 is shared.

As shown in FIG. 2D, before performing the fourth step 4, a second plating resist 29 is disposed in the suspension board with circuit 21 in a pattern of exposing the conductive terminal 28 and the neighborhood thereof and covering the stainless steel supporting layer 22 including the first gold plating layer 31 and the second gold plating layer 32.

The fourth step 4 is gold strike plating. The action and the first gold plating solution in the fourth step 4 are the same as those in the second step 2. To be specific, in the fourth step 4, the assembly sheet 30 is continuously sent out (conveyed) from the first roll 43 toward the first plating tank 41. In this manner, the conductive terminal 28 is immersed in the first gold plating solution. That is, the second step 2 and the fourth step 4 are performed in the same (common) first plating tank 41. The action in the fourth step 4 is the same as that in the second step 2. The second step 2 and the fourth step 4 are performed in the same (common) first plating tank 41.

The current density in the fourth step 4 is the current density of the regular gold strike plating.

The current density of the conductive terminal 28 in the fourth step 4 is that of the conductive terminal 28 in the regular gold strike plating, and is, for example, 0.3 A/dm$^2$ or more, and for example, 20 A/dm$^2$ or less. The current density of the conductive terminal 28 is an amount of current of the conductive terminal 28 per unit area, and is a value (application current [A]/surface area [dm$^2$] of the conductive terminal 28) obtained by dividing the application current by the surface area (exposed area) of the conductive terminal 28.

The ratio of the current density of the stainless steel terminal 26 in the second step 2 to that of the conductive terminal 28 in the fourth step 4 (the current density of the stainless steel terminal 26 in the second step 2/the current density of the conductive terminal 28 in the fourth step 4) is, for example, 2 or more, preferably 10 or more, more preferably 15 or more, further more preferably 30 or more, and for example, 1000 or less. When the above-described ratio is the above-described lower limit or more, in the second step 2, the passive film 25 can be more surely removed, while an outflow of the conductive material to the first gold plating solution caused by excessively high current density in the fourth step 4 can be suppressed.

By the fourth step 4, the third gold plating layer 33 is formed on the surface of the conductive terminal 28. Simultaneously, foreign materials (including wastes) attached to the surface of the conductive terminal 28 are removed.

The third gold plating layer 33 has a thickness of, for example, 10 nm or more, preferably 50 nm or more, and for example, 5000 nm or less, preferably 3000 nm or less.

The fifth step 5 is gold soft plating. The action and the second gold plating solution in the fifth step 5 are the same as those in the third step 3. The third step 3 and the fifth step 5 are performed in the same (common) second plating tank 42.

The action in the fifth step 5 is the same as that in the third step 3. The third step 3 and the fifth step 5 are performed in the same (common) second plating tank 42.

The current density of the third gold plating layer 33 in the fifth step 5 is that of the third gold plating layer 33 in the regular gold strike plating, and is, for example, 0.1 A/dm$^2$ or more, and for example, 20 A/dm$^2$ or less. The current density of the third gold plating layer 33 is an amount of current of the third gold plating layer 33 per unit area, and is a value (application current [A]/surface area [dm$^2$] of the third gold plating layer 33) obtained by dividing the application current by the surface area (exposed area) of the third gold plating layer 33.

In this manner, the third gold plating layer 33 and the fourth gold plating layer 34 are sequentially formed on the surface of the conductive terminal 28.

The fourth gold plating layer 34 has a thickness of, for example, 0.1 µm or more, preferably 0.3 µm or more, and for example, 10 µm or less, preferably 1 µm or less.

Thereafter, as shown in FIG. 2F, the second plating resist 29 is removed.

In this manner, the suspension board with circuit 21 including the stainless steel terminal 26 in which the first gold plating layer 31 and the second gold plating layer 32 (the gold plating layer 35) are sequentially formed on the surface thereof, and the conductive terminal 28 in which the third gold plating layer 33 and the fourth gold plating layer 34 are sequentially formed on the surface thereof is obtained.

[Sixth Step]

In the sixth step 6, the suspension board with circuit 21 is heated. To be specific, the first gold plating layer 31, the second gold plating layer 32, the third gold plating layer 33, and the fourth gold plating layer 34 are heated.

To be more specific, the assembly sheet 30 is conveyed so as to pass through a heating furnace.

The heating temperature is, for example, 180° C. or more, preferably 200° C. or more, and for example, 350° C. or less, preferably 300° C. or less.

The heating time is, for example, 0.5 hours or more, preferably 1 hour or more, and for example, 3 hours or less, preferably 2 hours or less.

By heating the suspension board with circuit 21, the adhesive properties of the first gold plating layer 31 and the second gold plating layer 32 with respect to the stainless steel terminal 26 are improved. Simultaneously, the adhesive properties of the third gold plating layer 33 and the fourth gold plating layer 34 with respect to the conductive terminal 28 are improved.

[Function and Effect]

According to the producing method, in the second step 2, the stainless steel supporting layer 22 is immersed in the first gold plating solution containing a weak acid and a gold compound without containing a strong acid, so that in the second step 2, when the electricity is supplied to the stainless steel supporting layer 22, the passive film 25 is surely removed and the first gold plating layer can be formed on the surface of the stainless steel terminal 26.

The first gold plating solution does not contain the strong acid, so that in the fourth step 4, when the first gold plating solution is used, the third gold plating layer 33 can be formed on the conductive terminal 28, while corrosion of the conductive terminal 28 is suppressed. Furthermore, the second step 2 and the fourth step 4 can be performed in the same plating solution, that is, the same first plating tank 41, so that the plating device 40 and the producing step can be simplified. Thus, the first gold plating layer 31 can be easily formed on the stainless steel terminal 26 with easy equipment.

According to the producing method, the content ratio of the gold compound in the second gold plating solution in the third step 3 is higher than that of the gold compound in the first gold plating solution in the second step 2, so that the thick second gold plating layer 32 can be efficiently formed for a short period of time.

In the producing method, when the ratio of the current density in the second step 2 to the current density in the fourth step 4 is 2 or more, the current density in the second step 2 can be set higher than that in the fourth step 4, so that in the second step 2, the passive film 25 can be further more surely removed. As a result, the suspension board with circuit 21 including the first gold plating layer 31 having adhesive properties with respect to the stainless steel terminal 26 can be produced.

According to the producing method, the second step 2 and the fourth step 4 are performed in the same plating bath, that is, the same first plating tank 41, so that the plating device 40 and the producing step can be simplified.

According to the producing method, in the sixth step 6, the first gold plating layer 31 is heated, so that the suspension board with circuit 21 including the first gold plating layer 31 having adhesive properties with respect to the stainless steel terminal 26 can be produced.

Furthermore, according to the producing method, in the sixth step 6, the first gold plating layer 31 and the second gold plating layer 32 are heated, so that the suspension board with circuit 21 including the first gold plating layer 31 and the second gold plating layer 32 having adhesive properties with respect to the stainless steel terminal 26 can be produced.

<Modified Example>

In the modified example, the same reference numerals are provided for members and steps corresponding to those described in the above-described one embodiment, and their detailed description is omitted.

In the conductive layer 24, an electrically conductive portion (not shown) that is electrically connected to the stainless steel terminal 26 is provided in an insulating opening portion (not shown) of the base insulating layer 23, and in the second step 2 and the third step 3, the electricity can be supplied from the conductive layer 24 to the stainless steel terminal 26 via the electrically conductive portion. In the fourth step 4 and the fifth step 5, the electricity can be also supplied from the stainless steel terminal 26 via the electrically conductive portion.

The method for producing the suspension board with circuit 21 can also include a cleansing step and a drying step. Although not shown in FIG. 3, for example, the cleansing step and the drying step are inserted between each of the steps.

Figure 5:
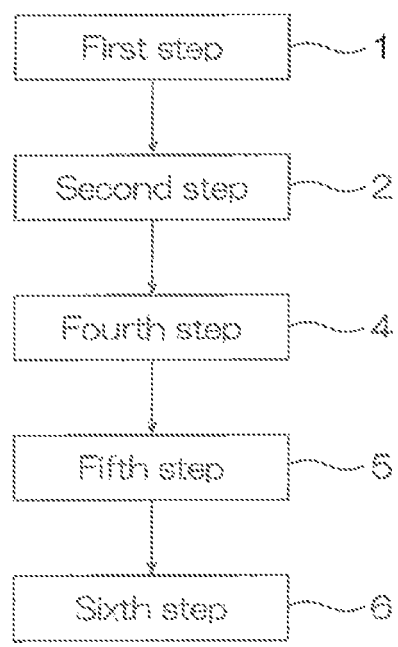
FIG. 5 shows a flow chart of a modified example (embodiment in which the third step is not performed) of the method for producing a suspension board with circuit.

As shown in FIG. 3, in one embodiment, the method for producing the suspension board with circuit 21 includes the third step 3. However, as shown in FIG. 5, the producing method does not include the third step 3, and the second step 2 and the fourth step 4 can be continuously performed.

In this case, by the second step 2, the gold plating layer 35 that consists of only the first gold plating layer 31 is formed. The application time in the second step 2 of the modified example is longer than that in the second step 2 of one embodiment.

As shown in FIG. 3, preferably, the suspension board with circuit 21 includes the third step 3.

In the third step 3, the second gold plating solution having the content ratio of the gold compound higher than that in the first gold plating solution is used, so that the thick second gold plating layer 32 can be formed for a short period of time and thus, the thick gold plating layer 35 can be formed for a short period of time.

In one embodiment, as shown in FIG. 3, the sixth step 6 is performed after the fifth step 5.

Figure 6:
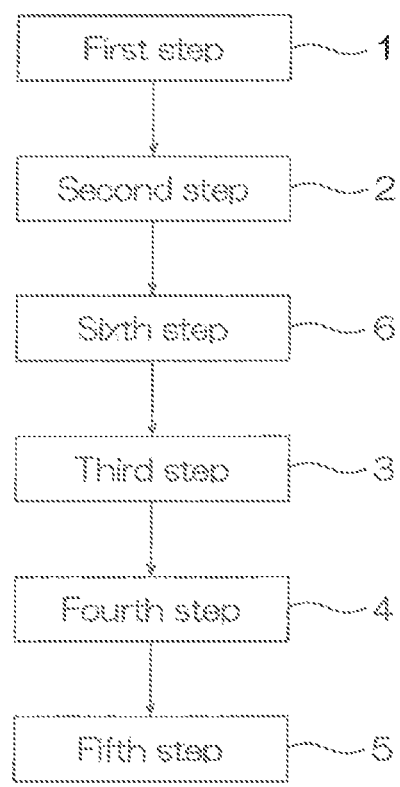
FIG. 6 shows a flow chart of a modified example (embodiment in which the second step and the sixth step are sequentially performed) of the method for producing a suspension board with circuit.
Figure 7:
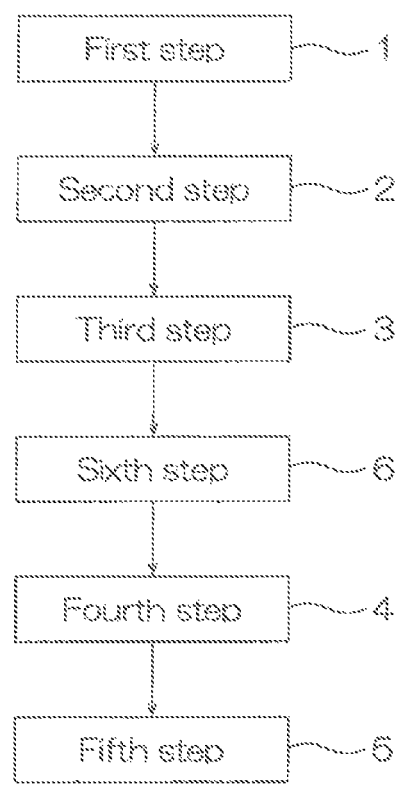
FIG. 7 shows a flow chart of a modified example (embodiment in which the third step and the sixth step are sequentially performed) of the method for producing a suspension board with circuit.

However, as shown in FIG. 6, the sixth step 6 can be also performed after the second step 2. As shown in FIG. 7, the sixth step 6 can be also performed after the third step 3.

In the modified example shown in FIG. 6, the sixth step 6 is performed after the second step 2 and before the third step 3. In the sixth step 6, the first gold plating layer 31 is heated. Thus, the suspension board with circuit 21 including the first gold plating layer 31 having adhesive properties with respect to the stainless steel terminal 26 can be produced.

Furthermore, in the modified example shown in FIG. 7, the sixth step 6 is performed after the third step 3 and before the fourth step 4. In the sixth step 6, the first gold plating layer 31 and the third gold plating layer 33 are heated. Thus, the suspension board with circuit 21 including the first gold plating layer 31 and the second gold plating layer 32 having adhesive properties with respect to the stainless steel terminal 26 can be produced.

The above-described one embodiment and modified example can be appropriately used in combination. For example, the sixth step 6 can be performed twice, and for example, as referred to FIGS. 3 and 6, the sixth step 6 can be performed immediately after the second step 2 and immediately after the fifth step 5. As referred to FIGS. 3 and 7, the sixth step 6 can be also performed immediately after the third step 3 and immediately after the fifth step 5.

Although not shown in FIGS. 1A to 2F, the passive film 25 may be also formed on the upper surface of the stainless steel supporting layer 22, to be specific, on the surface that is in contact with the base insulating layer 23 in the stainless steel supporting layer 22.

In one embodiment, as shown in FIGS. 1A to 2F, and 4, the first gold plating layer 31 and the third gold plating layer 33 are formed in the suspension boards with circuit 21 that are the same kind in the same first plating tank 41.

Figure 8A:
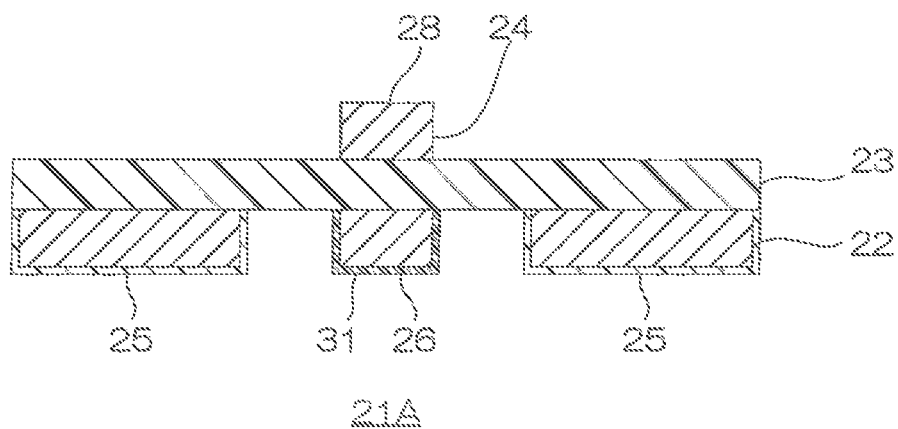
FIGS. 8A and 8B show partial process drawings of a modified example (method for producing a first suspension board with circuit without including a third gold plating layer and a fourth gold plating layer on a conductive terminal) of the method for producing a suspension board with circuit.
Figure 9A:
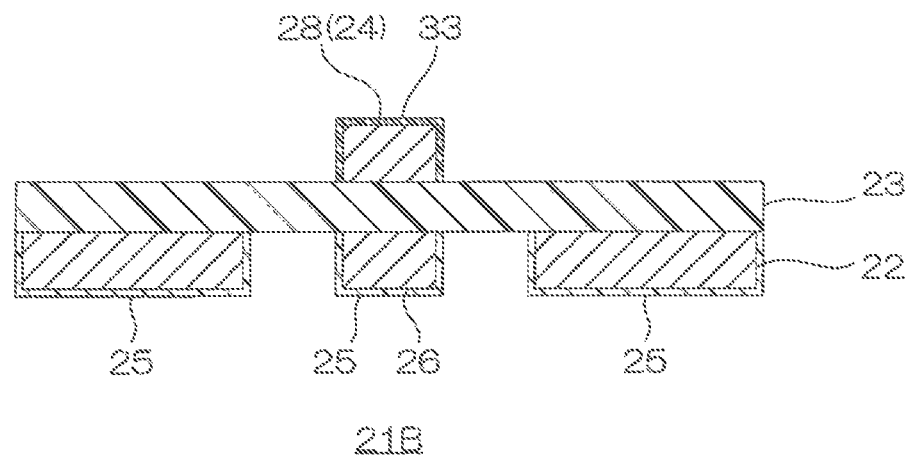
FIGS. 9A and 9B show partial process drawings of a modified example (method for producing a second suspension board with circuit without including a first gold plating layer and a second gold plating layer on a stainless steel terminal) of the method for producing a suspension board with circuit.

However, for example, in the modified example, as shown in FIG. 8A, the first gold plating layer 31 is formed in a first suspension board with circuit 21A by using the first gold plating bath, and separately, as shown in FIG. 9A, the third gold plating layer 33 can be also formed in a second suspension board with circuit 21B that is different from the first suspension board with circuit 21A by using the first gold plating bath.

Figure 8B:
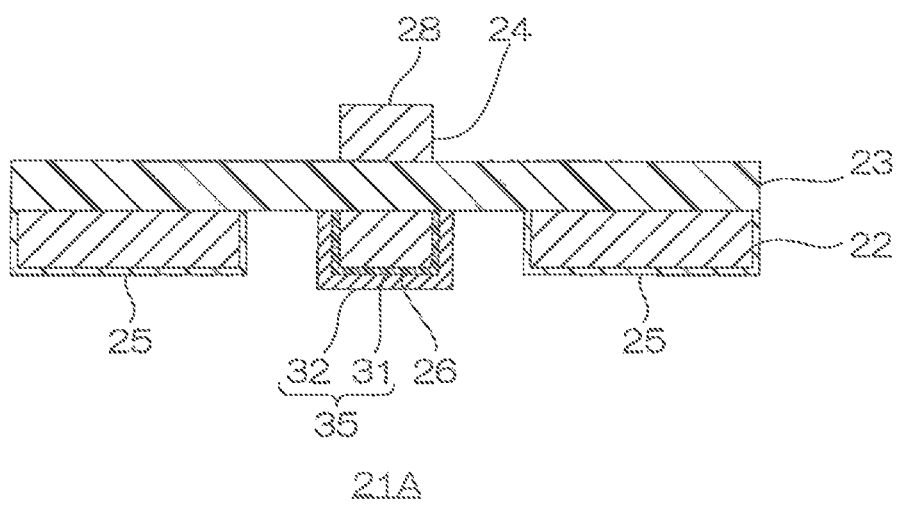
Figure 9B:
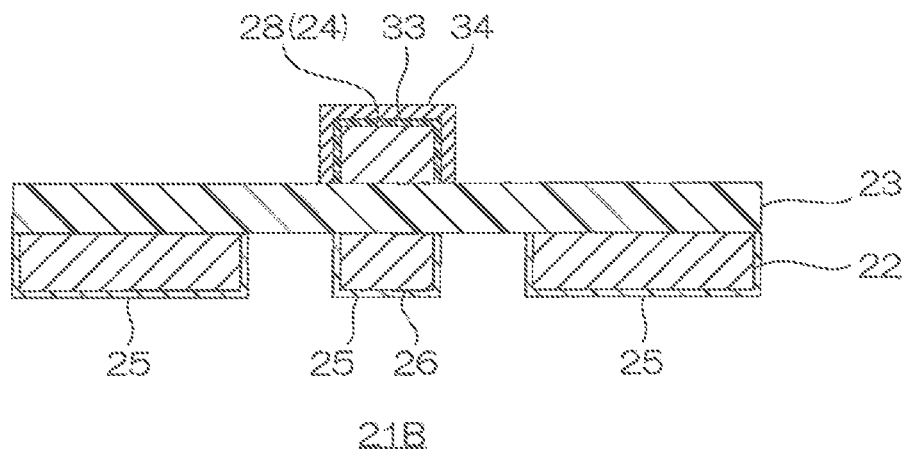

In FIGS. 8A and 8B, the first plating resist 27 is omitted, and in FIGS. 9A and 9B, the second plating resist 29 is omitted.

As shown in FIGS. 8A and 8B, for example, the first suspension board with circuit 21A is shipped as a product without forming the third gold plating layer 33 and the fourth gold plating layer 34 on the conductive terminal 28. That is, the method for producing the first suspension board with circuit 21A includes the second step 2 (ref: FIG. 8A) in which the first gold plating layer 31 is formed and the third step 3 (ref: FIG. 8B) in which the second gold plating layer 32 is formed without including the fourth step 4 and the fifth step 5.

Meanwhile, as shown in FIGS. 9A and 9B, the second suspension board with circuit 21B is shipped as a product without forming the first gold plating layer 31 and the second gold plating layer 32 in the stainless steel terminal 26 and by allowing the passive film 25 to remain in the stainless steel terminal 26. That is, the method for producing the second suspension board with circuit 21B includes the fourth step 4 (ref: FIG. 9A) in which the third gold plating layer 33 is formed and the fifth step 5 (ref: FIG. 9B) in which the fourth gold plating layer 34 is formed without including the second step 2 and the third step 3.

In the modified example, the same function and effect as that described above can be achieved. Furthermore, each of the first suspension board with circuit 21A and the second suspension board with circuit 21B can be produced by the plating device 40 in which the number of equipment is reduced.

In one embodiment, as an example of the wired circuit board of the present invention, the suspension board with circuit 21 is illustrated. However, the example is not limited to this. For example, as the wired circuit board of the present invention, another wired circuit board such as a flexible wired circuit board including the stainless steel supporting layer 22 as a reinforcing layer can be also used.

In each of the modified examples described above, the same function and effect as that of the above-described one embodiment can be achieved.

Furthermore, each of the modified examples described above can be appropriately used in combination.

EXAMPLES

Next, the present invention is further described based on Examples below. The present invention is however not limited by the following Examples. The specific numerical values in mixing ratio (content ratio), property value, and parameter used in the following description can be replaced with upper limit values (numerical values defined as "or less" or "below") or lower limit values (numerical values defined as "or more" or "above") of corresponding numerical values in mixing ratio (content ratio), property value, and parameter described in the above-described "DETAILED DESCRIPTION OF THE INVENTION".

Example 1

As shown in FIG. 3, by the producing method that sequentially included the first step 1, the second step 2, the third step 3, the fourth step 4, the fifth step 5, and the sixth step 6, the suspension board with circuit 21 was produced.

To be specific, as shown in FIG. 1A, in the first step 1, the suspension board with circuit 21 was prepared in which the stainless steel supporting layer 22 having the stainless steel terminal 26, the base insulating layer 23 disposed on the upper surface of the stainless steel supporting layer 22, the conductive layer 24 disposed on the upper surface of the base insulating layer 23 and having the conductive terminal 28, and a cover insulating layer exposing the conductive terminal 28 on the upper surface of the base insulating layer 23 were included.

The stainless steel supporting layer 22 (the stainless steel terminal 26) was made of SUS 304 and had a thickness of 25 μm. The passive film 25 having a thickness of 5 nm was formed on the surface of the stainless steel supporting layer 22.

The base insulating layer 23 was made of polyimide and had a thickness of 10 μm.

The conductive layer 24 (the conductive terminal 28) was made of copper and had a thickness of 20 μm.

The cover insulating layer was made of polyimide.

The assembly sheet 30 in which the plurality of suspension boards with circuit 21 described above were disposed in alignment was prepared.

Next, as shown in FIG. 1B, the first plating resist 27 was disposed in the suspension board with circuit 21 so as to expose the stainless steel terminal 26 and the neighborhood thereof and cover the conductive layer 24.

Separately, as shown in FIG. 4, the plating device 40 sequentially including the first roll 43, the first plating tank 41, the second plating tank 42, and the second roll 44 toward the conveyance direction of the assembly sheet 30 was prepared.

The first plating tank 41 was filled with the first gold plating solution having the following composition and temperature so as to immerse the first electrode.

<First Gold Plating Solution>

| | |
|---|---|
| Gold potassium cyanide (KAu (CN)$_2$) | 0.15 mass % |
| | (gold concentration of 1 g/L) |
| Organic acid | 9 to 11 mass % |
| Organic acid salt | 7 to 9 mass % |
| pH | 3.5 to 4.0 |
| Temperature | 50° C. |

The second plating tank 42 was filled with the second gold plating solution having the following composition and temperature so as to immerse the second electrode.

<Second Gold Plating Solution>

| | |
|---|---|
| Gold potassium cyanide (KAu (CN)$_2$) | 1.17 mass % |
| | (gold concentration of 8 g/L) |
| Organic acid salt | 10 to 15 mass % |
| Inorganic acid salt | 2 to 3 mass % |
| Thallium sulfate | 0.001 mass % |
| pH | 6.5 |
| Temperature | 65° C. |

The above-described assembly sheet 30 was provided in the plating device 40. To be specific, the assembly sheet 30 was wound around the first roll 43.

Next, the second step 2 that was the gold strike plating was performed.

To be specific, as shown in FIG. 4, in the second step 2, the assembly sheet 30 was continuously sent out (conveyed) from the first roll 43 toward the first plating tank 41. In this manner, the stainless steel terminal 26 (the stainless steel supporting layer 22) was immersed in the first gold plating solution.

In the second step 2, a voltage was applied between the stainless steel terminal 26 and the first electrode by the first rectifier. The current density of the stainless steel terminal 26 was 20 A/dm$^2$. The application time was 25 seconds.

Then, as shown in FIG. 1B, the first gold plating layer 31 was formed on the surface of the stainless steel terminal 26, while the passive film 25 was removed. The first gold plating layer 31 had a thickness of 150 nm.

Next, the third step 3 that was the gold soft plating was performed.

To be specific, as shown in FIG. 4, in the third step 3, the assembly sheet 30 in which the first gold plating layer 31 was formed was continuously sent out (conveyed) toward the second plating tank 42. In this manner, the first gold plating layer 31 was immersed in the second gold plating solution.

In the third step 3, a voltage was applied between the first gold plating layer 31 and the second electrode by the second rectifier. The current density of the stainless steel terminal 26 (the first gold plating layer 31) was 0.3 A/dm$^2$. The application time was 300 seconds.

As shown in FIG. 1C, in this manner, the second gold plating layer 32 was formed on the surface of the first gold plating layer 31. The second gold plating layer 32 had a thickness of 70 nm.

Thereafter, the first plating resist 27 was removed.

Thereafter, as shown in FIG. 2D, the second plating resist 29 was disposed so as to expose the conductive terminal 28 and the neighborhood thereof, and cover the stainless steel supporting layer 22 including the stainless steel terminal 26 (and the first gold plating layer 31 and the second gold plating layer 32 that were formed on the surface thereof).

Thereafter, as shown in FIG. 4, the assembly sheet 30 in which the second plating resist 29 was disposed was wound up by the second roll 44.

Thereafter, the gold strike plating was performed with respect to the conductive terminal 28 of the assembly sheet 30 by using the same plating device 40 as that described above. The second roll 44 that wound up the assembly sheet 30 was disposed at the upstream side of the first plating tank 41 as the first roll 43 of the same plating device as the plating device 40 used in the gold strike plating with respect to the stainless steel terminal 26.

To be specific, in the fourth step 4 that was the gold strike plating, as shown in FIG. 4, the assembly sheet 30 was continuously sent out (conveyed) from the first roll 43 toward the first plating tank 41 (the first plating tank 41 that was the same in the second step 2). In this manner, the conductive terminal 28 was immersed in the first gold plating solution.

In the fourth step 4, a voltage was applied between the conductive terminal 28 and the first electrode by the first rectifier. The current density of the conductive terminal 28 was 1 A/dm$^2$ The application time was 25 seconds.

Then, as shown in FIG. 2D, the third gold plating layer 33 was formed on the surface of the conductive terminal 28, while foreign materials (including wastes) attached to the surface of the conductive terminal 28 were removed. The third gold plating layer 33 had a thickness of 100 nm.

Next, the fifth step 5 that was the gold soft plating was performed.

As shown in FIG. 4, to be specific, in the fifth step 5, the assembly sheet 30 in which the third gold plating layer 33 was formed was continuously sent out (conveyed) toward the second plating tank 42 (the second plating tank 42 that was the same in the third step 3). In this manner, the third gold plating layer 33 was immersed in the second gold plating solution.

In the fifth step 5 that was the gold soft plating, a voltage was applied between the third gold plating layer 33 and the second electrode by the second rectifier. The current density of the third gold plating layer 33 was 1.7 A/dm$^2$. The application time was 300 seconds.

As shown in FIG. 2E, in this manner, the fourth gold plating layer 34 was formed on the surface of the third gold plating layer 33. The fourth gold plating layer 34 had a thickness of 400 nm.

As shown in FIG. 2F, thereafter, the second plating resist 29 was removed.

The assembly sheet 30 was wound up by the second roll 44.

As shown in FIG. 4, in this manner, the suspension board with circuit 21 including the stainless steel terminal 26 in which the passive film 25 was removed, and the first gold plating layer 31 and the second gold plating layer 32 were sequentially formed, and the conductive terminal 28 in which the third gold plating layer 33 and the fourth gold plating layer 34 were sequentially formed was obtained.

Thereafter, the sixth step 6 was performed. To be specific, the assembly sheet 30 was heated under the vacuum atmosphere. The heating temperature was 200° C., and the heating time was 1 hour.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A method of producing a wired circuit board including a stainless steel supporting layer having a stainless steel terminal, comprising:
    a first step of preparing the stainless steel supporting layer having a passive film formed on a surface thereof and
    a second step of forming a first gold plating layer on a surface of the stainless steel terminal, wherein
    in the second step,
    the stainless steel supporting layer is immersed in a first gold plating solution,
    electricity is supplied to the stainless steel supporting layer so that both the passive film is removed and the first gold plating layer is formed on the surface of the stainless steel terminal during the second step,
    the wired circuit board further includes a conductive layer supported by the stainless steel supporting layer and having a conductive terminal, further comprising:
    a fourth step of forming a third gold plating layer on the surface of the conductive terminal; wherein
    in the fourth step,
    the conductive layer is immersed in a third gold plating solution, and
    electricity is supplied to the conductive layer so that the third gold plating layer is formed on the surface of the conductive terminal; and
    the ratio of the current density in the second step to the current density in the fourth step is 2 or more.

2. The method of producing a wired circuit board according to claim 1 further comprising:
    after the second step, a third step of forming a second gold plating layer on the surface of the first gold plating layer; wherein
    in the third step,
    the stainless steel supporting layer is immersed in a second gold plating solution consisting of a gold compound and at least one of an organic acid salt, an inorganic acid salt, or a crystal regulator, and
    electricity is supplied to the stainless steel supporting layer so that the second gold plating layer is formed on the surface of the first gold plating layer; and
    the content ratio of the gold compound in the second gold plating solution is higher than that of the gold compound in the first gold plating solution.

3. The method of producing a wired circuit board according to claim 1, wherein
    the second step and the fourth step are performed in the same plating bath.

4. The method of producing a wired circuit board according to claim 1 further comprising:
    after the second step, a heating step of heating the first gold plating layer.

* * * * *